United States Patent
Chen

(10) Patent No.: US 7,177,606 B2
(45) Date of Patent: Feb. 13, 2007

(54) CONTROL SYSTEM FOR CONTROLLING AN OUTPUT SIGNAL POWER LEVEL OF A WIRELESS TRANSMITTER

(75) Inventor: Keming Joseph Chen, San Diego, CA (US)

(73) Assignee: General Instrument Corporation, Horsham, PA (US)

( * ) Notice: Subject to any disclaimer, the term of this patent is extended or adjusted under 35 U.S.C. 154(b) by 785 days.

(21) Appl. No.: 10/195,017

(22) Filed: Jul. 10, 2002

(65) Prior Publication Data
US 2004/0092237 A1    May 13, 2004

(51) Int. Cl.
*H04B 7/00* (2006.01)
*H04B 7/16* (2006.01)

(52) U.S. Cl. .................. 455/126; 455/192.1; 455/227; 455/334

(58) Field of Classification Search ............... 455/126, 455/127.1, 130, 133, 136, 140, 192.1, 200.1, 455/177.1, 182.1, 227, 232.1, 334, 339, 340
See application file for complete search history.

(56) References Cited

U.S. PATENT DOCUMENTS

| | | | |
|---|---|---|---|
| 4,803,440 A | 2/1989 | Hotta et al. | |
| 5,271,011 A | 12/1993 | McMullan, Jr. et al. | |
| 5,287,555 A | 2/1994 | Wilson et al. | |
| 5,457,811 A * | 10/1995 | Lemson | 455/67.11 |
| 5,608,171 A * | 3/1997 | Hunter et al. | 73/861.3 |
| 6,018,650 A * | 1/2000 | Petsko et al. | 455/234.1 |
| 6,097,765 A | 8/2000 | Corrigan, III et al. | |
| 6,256,483 B1 * | 7/2001 | Moerder et al. | 455/115.1 |
| 6,272,336 B1 * | 8/2001 | Appel et al. | 455/423 |
| 6,812,824 B1 * | 11/2004 | Goldinger et al. | 340/10.1 |

\* cited by examiner

*Primary Examiner*—Tony T. Nguyen
(74) *Attorney, Agent, or Firm*—Larry T. Cullen

(57) ABSTRACT

A method and system for controlling an output signal power level of a wireless transmitter can be created by detecting the signal power level of the transmitter with a detector, selectively attenuating the output signal power level with an attenuator having variable attenuation levels, and monitoring the output signal power level and comparing the output signal power level, as determined by the detector, to a predetermined threshold with a processor. The processor preferably controls the attenuator in accordance with the comparison of the output signal power level and the predetermined threshold.

30 Claims, 3 Drawing Sheets

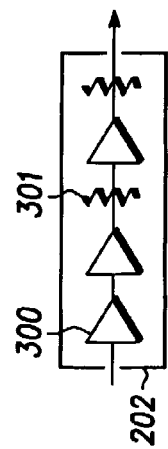
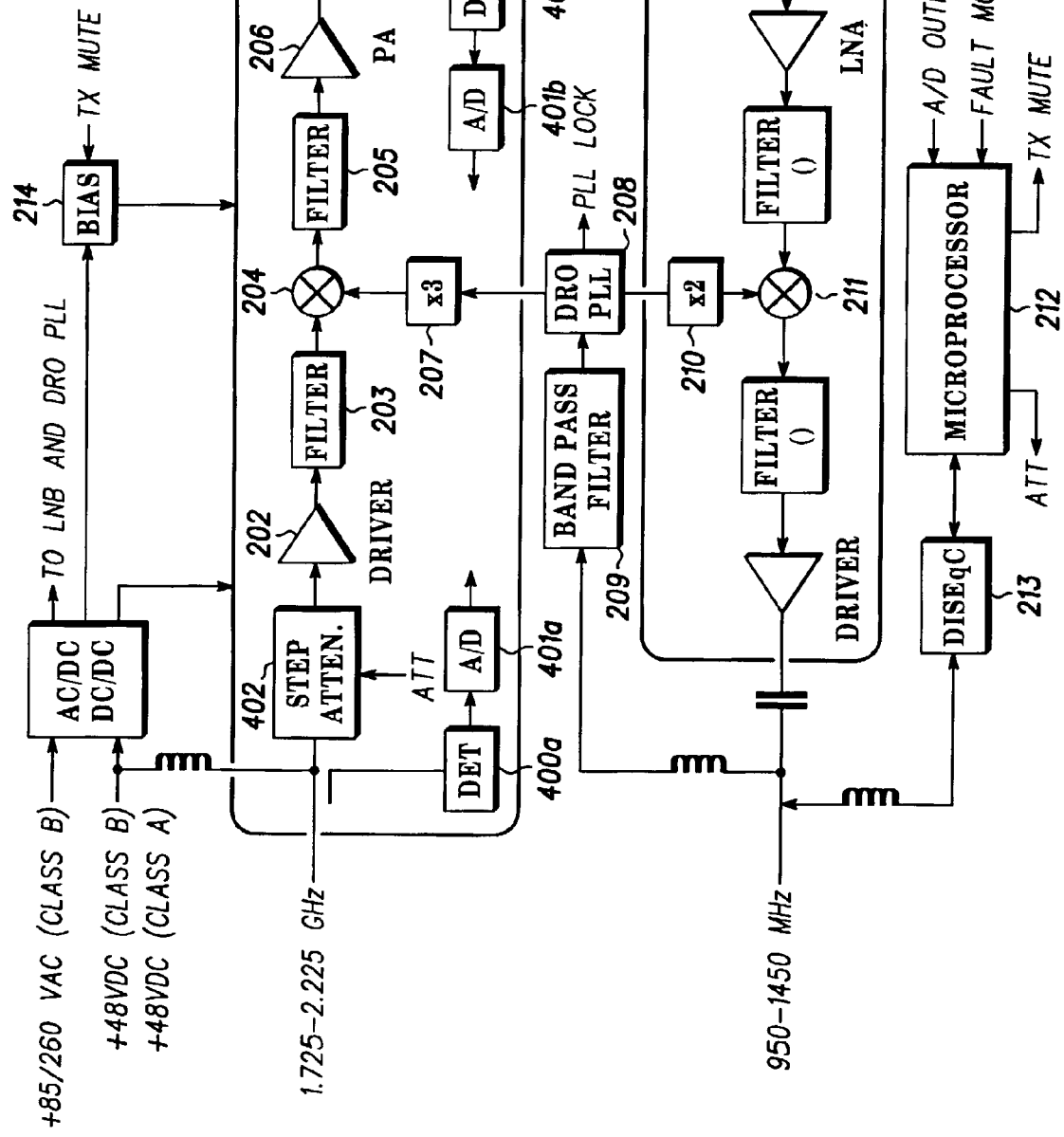

CONTROL SYSTEM FOR CONTROLLING AN OUTPUT SIGNAL POWER LEVEL OF A WIRELESS TRANSMITTER

FIELD OF THE INVENTION

The present invention relates to the field of wireless transmitters. More specifically, the present invention relates to the field of two-way satellite communication systems and other transmission systems where the maximum transmit signal power level is regulated.

BACKGROUND OF THE INVENTION

Two-way satellite communication systems transmit and receive data in various frequency bands. For example, some systems operate in the $K_a$-band, which is between about 17 and 36 GHz. Other systems operate in bands such as the C-band (3.7–6.4 GHz) or the $K_u$-band (11–15 GHz), for example. Future systems may use higher frequencies (e.g., 60 GHz).

Modulation and upconversion are essential methods used in two-way satellite communication systems and in other wireless communication systems. Upconversion is the translation of a signal's frequency from baseband, or the original frequency before modulation, to a higher frequency. The signal is then transmitted at this higher frequency. Upconversion is performed because most antennas can only receive signals that have short wavelengths. Frequency is the inverse of wavelength. Therefore, the higher the frequency a signal has, the shorter its wavelength. Consequently, signals upconverted to a higher frequency are easier to transmit.

Modulation is a method used to transmit and receive data using a carrier signal. Modulated signals can be analog or digital signals. By varying the phase of a digital carrier signal, for example, information can be conveyed. This type of modulation is called phase-shift keying (PSK). There are several schemes that can be used to accomplish PSK. The simplest method uses only two signal phases: 0 degrees and 180 degrees. The digital signal is broken up time wise into individual bits (binary digits—zeros and ones). The state of each bit is determined according to the state of the preceding bit. If the phase of the wave does not change, then the signal state stays the same (low or high). If the phase of the wave changes by 180 degrees-that is, if the phase reverses-then the signal state changes (from low to high, or from high to low). Because there are two possible wave phases, this form of PSK is sometimes called Binary Phase Shift Keying (BPSK).

A more complex form of PSK is called Quadrature Phase Shift Keying (QPSK). QPSK modulation employs four wave phases and allows binary data to be transmitted at a faster rate per phase change than is possible with BPSK modulation. In QPSK modulation, the signal to be transmitted is first separated into two signals: the In-phase (I) signal and the Quadrature (Q) signal. The I and Q signals are orthogonal, or 90 degrees out of phase. Thus, they are totally independent and do not interfere with each other. Each signal can then be phase shifted independently. Both the I and Q signals have two possible phase states. Combining the possible states for the I and Q signals results in four total possible states. Each state can then represent two bits. Thus, twice the information can be conveyed using QPSK modulation instead of BPSK modulation. For this reason, QPSK modulation is used in many two-way satellite communication systems.

Currently, upconversion in most two-way satellite communication systems entails a multi-stage conversion process. First, baseband QPSK I, Q streams are modulated and then upconverted to an Intermediate Frequency (IF) (e.g., 1.7–2.2 GHz). This conversion is performed by in an Indoor Unit (IDU). The signal is then upconverted again to a transmit frequency, $f_{TX}$ (e.g., 29.5–30.0 GHz), in an Outdoor Unit (ODU) located at the terminal's antenna. The upconversion is then complete and the signal is ready for transmission.

The output signal (transmit signal) of the ODU has associated with it a certain power level. The ODU output signal power level is regulated in many countries and cannot exceed certain levels. The maximum allowable output signal power level varies by country.

In many two-way satellite communication systems, for example, the optimal output signal power level of the ODU is 4 watts. Some countries allow this output signal power level. However, other countries are more limiting in their regulations and allow ODU output signal power levels of no more than 2 watts, for example.

A high ODU output signal power level is preferable to a low ODU output signal power level because the higher output signal power level is easier to detect and receive. A high ODU output signal power level requires a smaller receiving antenna than does a small ODU output signal power level. Small antennas are usually easier and more cost-effective to design and construct than are large antennas.

The same various limitations on transmitter output signal power levels could be imposed on any transmitting device used in wireless communication systems. Thus, as used hereafter and in the appended claims, the term "two-way satellite communication systems" will be used to refer expansively to all possible two-way satellite communication systems and other applications where the maximum output signal power level of a transmitter is regulated. In addition, the term "ODU" will be used to refer expansively to all possible transmitters.

Thus, there is a need in the art for a method and system of limiting the ODU output signal power level to various levels so that it is always equal to the maximum allowable power level depending on the country within which the two-way satellite communication system operates.

There have been several approaches to complying with the various ODU output signal power level restrictions. One solution is to fix the ODU output signal power level to equal the lowest maximum allowable output signal power level of the countries within which the two-way satellite communication system might operate. For example, if the lowest maximum allowable output signal power level is 2 watts, the ODU amplification circuitry could be modified so that the maximum power level of the output signal never exceeds 2 watts. This ODU output signal power level is obviously not optimal in the countries with higher maximum allowable output signal power levels.

Another traditional solution to limit the ODU output signal power level to various levels is to use Automatic Gain Control (AGC). AGC is a process or means by which the gain (output power versus input power) of the ODU is automatically adjusted as a function of a specified parameter, such as the output signal level. However, AGC cannot be used in the ODU of many two-way satellite communication systems because it takes too long to lock into the desired gain. Also, the ODU output signal power level needs to change according to varying weather conditions. It is currently difficult, if not impossible, for an AGC circuit to adjust for varying weather conditions.

Another possible solution is an IDU that is capable of adjusting the ODU input signal level power. This requires a means for calculating the ODU gain and an interface unit for communicating this gain information to the IDU. The IDU would then need to adjust the ODU input signal power level based on this gain information so that the ODU output signal power level can change to the desired level. However, this process is currently limited by the speed at which the interface unit between the IDU and ODU operates and is therefore too slow for many applications. In addition, it requires an IDU capable of adjusting the input signal level power of the ODU. This capability might not be present in many systems.

Another possible solution that has been explored is to monitor the direct current (DC) current of the output signal of the ODU. Then, according to the monitored DC current, the IDU varies the output signal level which is input into the ODU to adjust the power level of the output signal.

For example, if the power level of the output signal is desired to be less than 2 watts, but it is currently higher than 2 watts, then the DC current of the output signal is higher than it would be at the desired power level. Reducing the ODU input signal power level decreases the ODU output signal power level as well as the DC current of the output signal.

However, in many two-way satellite communication systems, it is difficult to correlate the DC current and the radio frequency (RF) output signal power. This is, in part, due to the use of a class-A wideband power amplifier (PA) in the ODU. Class-A PAs are used because they reproduce the input signal with little distortion. They are, however, the least efficient among the different classes of PAs because the power of their output signals is only a small percentage of the DC power used in the amplification process. The degree of inefficiency varies from PA to PA and thus, the correlation between the DC current of the output signal and its power level is unpredictable.

SUMMARY OF THE INVENTION

A wireless transmitter system includes an outdoor unit configured to process an input signal having an associated input signal power level and generate an output signal having an associated output signal power level. The output signal power level initially depends on the input signal power level. The system further includes an indoor unit for generating the input signal and initializing the input signal power level such that the output signal power level is substantially equal to a predetermined threshold. After the indoor unit initializes the input signal power level, the outdoor unit independently controls the output signal power level using an attenuator in accordance with a comparison of the output signal power level and the predetermined threshold.

Additional advantages and novel features of the invention will be set forth in the description which follows or may be learned by those skilled in the art through reading these materials or practicing the invention. The advantages of the invention may be achieved through the means recited in the attached claims.

BRIEF DESCRIPTION OF THE DRAWINGS

The accompanying drawings illustrate preferred embodiments of the present invention and are a part of the specification. Together with the following description, the drawings demonstrate and explain the principles of the present invention. The illustrated embodiments are examples of the present invention and do not limit the scope of the invention.

FIG. 3 is a block diagram of a driver circuit that could be used to implement an embodiment of the present invention.

FIG. 4 illustrates a configuration whereby the ODU input and output signal power levels are monitored by a microprocessor and attenuated by a step attenuator such that the output signal power level becomes equal to the maximum allowable power level according to an embodiment of the present invention.

Throughout the drawings, identical reference numbers designate similar, but not necessarily identical, elements.

DETAILED DESCRIPTION OF THE PREFERRED EMBODIMENTS

The present invention provides a method and system whereby an ODU produces an output signal with a maximum possible power level that stays within various signal power level restrictions. An IDU capable of adjusting the ODU input signal power level is not necessary under the embodiments of the present invention.

Using the drawings, the preferred embodiments of the present invention will now be explained.

Figure 1:
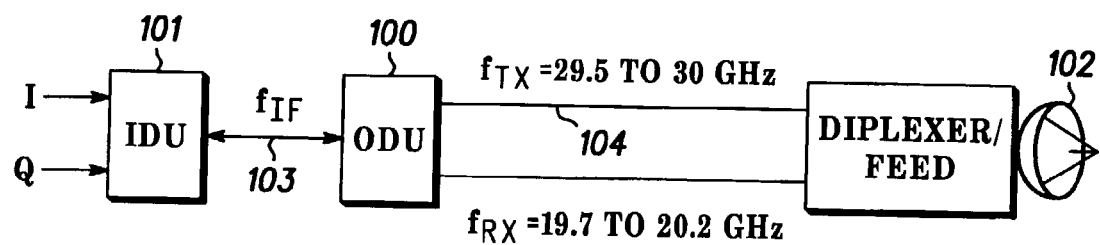
FIG. 1 is a block diagram of a multi-stage modulator and upconverter that is used in an exemplary two-way satellite communication system and that could be used to implement an embodiment of the present invention.

FIG. 1 is a block diagram of a multi-stage modulator and upconverter that is used in an exemplary two-way satellite communication system and that could be used to implement an embodiment of the present invention. As shown in FIG. 1, baseband QPSK I and Q signals are modulated and upconverted to an intermediate frequency (IF), $f_{IF}$, in the IDU (101). The IF, $f_{IF}$, is within, but not limited to, the L-band range (e.g., 1.7–2.2 GHz). This range is preferable because it is high enough that the ODU (100) upconversion will allow filtering of the ODU (100) local oscillator (LO).

The IDU (101) output signal is then sent to the ODU (100) via a connecting cable (103). The connecting cable (103) can be coaxial cable, for example. The ODU (100) modulates the signal received from the IDU (101) and upconverts it to the transmit frequency, $f_{TX}$. The transmit frequency, $f_{TX}$, is between 29.5 and 30 GHz in this exemplary system. These frequencies are within the Ka-band. Once the signal has been upconverted to the frequency $f_{TX}$, it is ready for transmission.

As shown in FIG. 1, the output signal of the ODU (100) is connected to an antenna (102). A preferred configuration of the ODU (100) in two-way satellite communication systems will be explained below in connection with FIG. 2.

The antenna (102) can be any of a number of different types of antennas. A preferable antenna in two-way satellite communication systems is a dish antenna (102), as shown in FIG. 1. The antenna (102) transmits the output signal of the ODU (100).

A more detailed description of the components that make up the ODU (100)—all or some of which might be used to implement an embodiment of the present invention—will be given using the detailed block diagram of FIG. 2.

Figure 2:
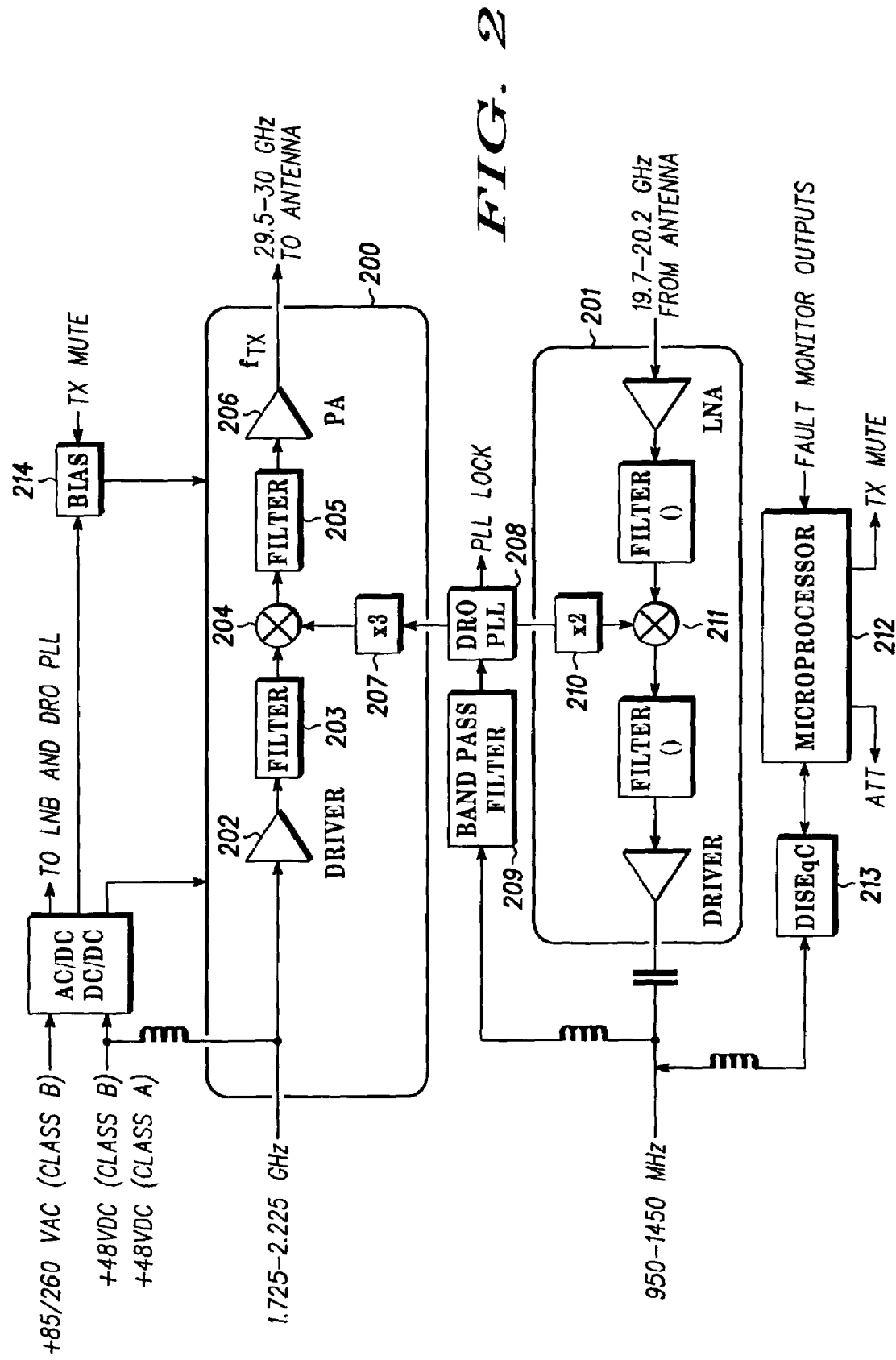
FIG. 2 is a detailed block diagram of ODU components, all or some of which might be used to implement an embodiment of the present invention.

As shown in FIG. 2, the ODU (100) comprises a Block Up-Converter (BUC) (200) and a Low Noise Block (LNB)

(201). The BUC (200) performs upconversion of a signal to be transmitted. The LNB (201), on the other hand, receives a signal transmitted from a satellite, for example, and down converts the signal (reduces its frequency) so that the received signal can be demodulated and its data extracted. The LNB (201) down converts the received signal because the detection circuitry (not shown) is preferably designed for lower frequencies and cannot operate with signals of frequencies in the GHz range.

For example, in many two-way satellite communication systems, the LNB (201) receives a signal of frequency $f_{RX}$ in the range of 19.7 GHz to 20.2 GHz as shown in FIG. 2. The LNB (201) down converts this signal to a frequency in the range of 950 MHz to 1450 MHz. The signal is then demodulated and down converted to baseband by the detection circuitry (not shown) where the data can be extracted from the signal.

The key components of the BUC (200), shown in FIG. 2, will now be explained.

An input signal with frequency $f_{IF}$ enters the BUC (200) and is input into a driver circuit (202). The driver circuit (202) is shown in more detail in FIG. 3. As shown in FIG. 3, the driver circuit (202) consists of a series of amplifiers (300) and thermopads (301). The amplifiers (300) amplify the input signal. The thermopads (301) compensate for changing temperature and keep the power output stable over temperature. The theremopads (301) provide power attenuation that varies with temperature, thus reducing the variations in the power of the signal.

Returning to FIG. 2, the signal output from the driver circuit (202) is then filtered with a filter (203) to remove the possible interference present at unwanted frequencies that would alias down and interfere with the desired signal during the detection process.

The filtered signal is then mixed with a signal of frequency $3*f_{DRO}$ (where * denotes multiplication) using an analog mixer (204). This signal is derived from the Dielectric Resonance Oscillator Phase Lock Loop (DRO PLL) (208). The DRO PLL (208) will be explained in more detail below.

Using common trigonometric identities, it can be shown that the signal output from the analog mixer (204) has a frequency $f_{TX}$ equal to $3*f_{DRO}-f_{IF}$, where $f_{DRO}$ is the frequency of the output signal of the DRO PLL (208). In many two-way satellite communication systems, $f_{TX}$ is in the range of 29.5 GHz to 30 GHz, as shown in FIG. 2.

The analog mixer (204) output signal is then filtered with another filter (205) before being amplified with a power amplifier (PA) (206) designed to amplify the signal to the optimal output power level (e.g., 4 watts). After being amplified by the PA (206), the signal is fed into an antenna (102; FIG. 1) preferably via a waveguide connector (104; FIG. 1). The antenna (102; FIG. 1) then transmits the signal.

As shown in FIG. 2, a single DRO PLL (208) is preferably used to implement the present invention. A reference signal of frequency $f_{REF}$ is generated in the IDU (101; FIG. 1) and sent to the ODU (100; FIG. 1). Inside the ODU (100; FIG. 1), a band pass filter (209) removes noise around this signal. The signal is then input into the DRO PLL (208) as its reference signal. The DRO PLL (208) generates a phase-locked signal (e.g., a sine wave) of frequency $f_{DRO}$. Different harmonics of this signal can be mixed with the transmit IF signal and the receive signal to obtain the desired output signals.

For example, in many two-way satellite communication systems, $f_{REF}$ is 10.575 MHz. The output of the DRO PLL (208) is a phase-locked signal with $f_{DRO}$ equal to 10.575 MHz. The third harmonic of this signal is obtained by multiplying the signal by 3 using a multiplier (207). This signal is then mixed with the output of the first BUC (200) filter (203), as explained above, with an analog mixer (204) resulting in a signal of frequency $f_{TX}$ equal to 29.5 GHz to 30 GHz.

In the LNB (201), on the other hand, the second harmonic of the output signal of the DRO PLL (208) is used to down convert the received signal from the antenna (102; FIG. 1) to a frequency of 950 MHz to 1450 MHz. The second harmonic is obtained by multiplying the output signal of the DRO PLL (208) by 2 using another multiplier (210). This signal is then mixed with the received signal from the antenna (102; FIG. 1) using another analog mixer (211).

As shown in FIG. 2, a microprocessor (212) is preferably used to monitor several status signals of the ODU (100; FIG. 1). Examples of signals to be monitored include the PLL Lock status output from the DRO PLL (208), Low DC Voltage status, and the ODU Controller status. The PLL Lock status indicates whether or not the output signal of the DRO PLL (208) is locked in phase. The low DC Voltage status monitors the DC voltage to make sure it is high enough for proper ODU (100; FIG. 1) operation. The ODU Controller status indicates the health of the ODU (100; FIG. 1) control electronics. If one of these status signals indicates an error in the ODU (100; FIG. 1), the microprocessor (212) outputs a signal, TX Mute, that stops the ODU (100; FIG. 1) from transmitting by adjusting a bias (214) that mutes the PA (206).

The ODU (100; FIG. 1) communicates the status signals to the IDU (101; FIG. 1) so that the IDU (101; FIG. 1) circuitry can attempt to rectify the problem. This communication is accomplished via a Digital Satellite Equipment Control (DiSEqC) (213). An exemplary DiSEqC (213) operates at 22 kHz and uses pulse width keying (PWK). DiSEqC (213) messages are sent as sequences of short bursts of 22 kHz tones. Each bit of data occupies a specific time and the proportion of that time filled with the 22 kHz burst determines whether that bit is a 1 or a 0.

FIG. 4 illustrates an embodiment of the present invention. The embodiment entails a method and system whereby the input signal power level and the output signal power level of the ODU (100; FIG. 1) are monitored by the microprocessor (212) and can be attenuated by a step attenuator (402) such that the output signal power level becomes equal to the maximum allowable power level. The embodiment will be explained in more detail below.

As shown in FIG. 4, the input and output signals of the ODU (100; FIG. 1) are coupled to detectors (400a,b). A preferable detector (400a,b) outputs a root-mean-square (rms) DC voltage that is equivalent to the detected signal power level. The detector (400a,b) can be a circuit comprising discrete components such as diodes, resistors, capacitors, and an operational amplifier. The detector can also be an integrated circuit (IC) chip, such as the AD8361 detector made by Analog Devices™.

After the detectors (400a,b), analog to digital converters (A/Ds) (401a,b) digitize the output signals of the detectors (400a,b), as shown in FIG. 4. Digitization is performed because preferable microprocessors (212) function with digital signal inputs. The A/D (401a,b) outputs are then input into the microprocessor (212). Some microprocessors (212) have built in A/Ds and in this case, the external A/Ds would no longer be needed.

The microprocessor (212) compares the digitized ODU (100; FIG. 1) output signal power level to a preset threshold. This preset threshold is preferably equivalent to the maximum allowable output signal power level. The threshold is programmable and can be varied.

If the ODU (100; FIG. 1) output signal power level is above the threshold, the microprocessor (212) switches in a step attenuator (402) with a control signal, ATT. The control signal, ATT, preferably indicates to the step attenuator (402) the amount of attenuation necessary for the ODU (100; FIG. 1) output power signal level to equal the threshold level.

The step attenuator (402) can be an IC or a circuit consisting of discrete components, for example. An exemplary step attenuator (402) has an attenuation range of 15 dB with a 0.5 dB step resolution. The attenuation range and step resolution can vary depending on the specifications of the application.

The step attenuator (402) attenuates the ODU (100; FIG. 1) input signal by the amount specified by the control signal, ATT. This results in the attenuation of the ODU (100; FIG. 1) output signal. This method and system of signal power attenuation attenuates the ODU (100; FIG. 1) output signal power level without terminating the ODU (100; FIG. 1) output signal. It is also faster than previous methods of attenuation where communication with the IDU (101; FIG. 1) is required because the use of a DiSEqC (213), which currently operates at relatively slow rates (e.g., 22 kHz), is not needed to attenuate the ODU (100; FIG. 1) output signal power level.

In a preferred embodiment, the settings of the step attenuator (402) are sent to the IDU (101; FIG. 1) through the DiSEqC (213), as shown in FIG. 4, so that the IDU (101; FIG. 1) does not continue increasing the signal level at the ODU (100; FIG. 1) input if the ODU (100; FIG. 1) output signal power level exceeds the threshold.

As previously explained, the ODU (100; FIG. 1) input signal power level is also monitored by the microprocessor (212). The ODU (100; FIG. 1) input signal power level is monitored for a variety of purposes including ODU (100; FIG. 1) fault detection, fault isolation, and initial gain setting at the IDU (101; FIG. 1).

If the ODU (100; FIG. 1) output signal power level is still over the threshold level after the step attenuator (402) is set to its maximum attenuation level, the microprocessor (212) can preferably generate the signal, TX Mute, which mutes the ODU (100; FIG. 1) output signal using the bias (214) as explained previously.

The preceding description has been presented only to illustrate and describe the invention. It is not intended to be exhaustive or to limit the invention to any precise form disclosed. Many modifications and variations are possible in light of the above teaching.

The preferred embodiment was chosen and described in order to best explain the principles of the invention and its practical application. The preceding description is intended to enable others skilled in the art to best utilize the invention in various embodiments and with various modifications as are suited to the particular use contemplated. It is intended that the scope of the invention be defined by the following claims.

What is claimed is:

1. A wireless transmitter system, said system comprising:
   an outdoor unit configured to process an input signal having an associated input signal power level and generate an output signal having an associated output signal power level initially depending on said input signal power level; and
   an indoor unit configured to generate said input signal and initialize said input signal power level such that said output signal power level is substantially equal to a predetermined threshold;
   wherein, after said input signal power level is initialized, said outdoor unit independently controls said output signal power level using an attenuator in accordance with a comparison of said output signal power level and said predetermined threshold,
   wherein said outdoor unit further comprises:
   a detector for detecting said output signal power level of said transmitter; and
   a processor for monitoring said output signal power level, and performing said comparison of said output signal power level to said predetermined threshold, and controlling said attenuator, and
   wherein,
   said outdoor unit is configured to generate one or more status signals, said status signals including data representing said input and output signal power levels; and
   said processor is configured to monitor said status signals and generate a mute signal that mutes said output signal power level if any of said status signals indicates an error in said outdoor unit.

2. The system of claim 1, wherein said predetermined threshold is programmable.

3. The system of claim 1, wherein said processor generates said mute signal if said output signal power level is above said predetermined threshold after said attenuator is set to a maximum attenuation level.

4. The system of claim 1, wherein said outdoor unit further comprises an analog-to-digital converter for digitizing an output of said detector.

5. The system of claim 1, wherein said outdoor unit further comprises a second detector for detecting said input signal power level, said processor further monitoring said input signal power level.

6. The system of claim 1, wherein said system is incorporated in a two-way satellite communication system.

7. The system of claim 1, wherein said data is sent from said outdoor unit to said indoor unit via an interface circuit whereupon said indoor unit 8. The system of claim 7, wherein, if said data indicates that said output signal power level is substantially less than said predetermined threshold, said indoor unit reinitializes said input signal power level such that said output signal power level is substantially equal to said predetermined threshold. reinitializes said input signal power in accordance with said data.

9. The system of claim 1, wherein said outdoor unit comprises a temperature compensation circuit for stabilizing said output signal power level.

10. The system of claim 1, wherein said predetermined threshold is a maximum allowable output signal power level.

11. The system of claim 10, wherein said outdoor unit continuously maintains said output signal power level at said level substantially equal to said maximum allowable output signal power level.

12. The system of claim 11, wherein said maximum allowable output signal power level is two watts.

13. A method of controlling an output signal power level of an outdoor unit of a wireless transmitter, said method comprising:

initializing an input signal power level of an input signal to said outdoor unit with an indoor unit such that said output signal power level is substantially equal to a predetermined threshold;

independently controlling said output signal power level with an attenuator of said outdoor unit in accordance with a comparison of said output signal power level and said predetermined threshold;

detecting said output signal power level of said outdoor unit;

monitoring said output signal power level;

performing said comparison of said output signal power level to said predetermined threshold;

controlling said attenuator;

generating one or more status signals, said status signals including data representing said input and output signal power levels;

monitoring said status signals; and muting said output signal power level if any of said status signals indicates an error in said outdoor unit.

14. The method of claim 13, further comprising programming said predetermined threshold.

15. The method of claim 13, further comprising muting said output signal power level if said output signal power level is above said predetermined threshold after said attenuator is set to a maximum attenuation level.

16. The method of claim 13, further comprising:
communicating said data from said outdoor unit to said indoor unit; and
reinitializing said input signal power in accordance with said data.

17. The method of claim 16, wherein, if said data indicates that said output signal power level is substantially less than said predetermined threshold, said step of reinitializing said input signal power level comprises reinitializing said input signal power level such that said output signal power level is substantially equal to said predetermined threshold.

18. The method of claim 13, further comprising compensating for temperature changes in said outdoor unit.

19. The method of claim 13, wherein said predetermined threshold is a maximum allowable output signal power level.

20. The method of claim 19, wherein said step of independently controlling said output signal power level comprises continuously maintaining said output signal power level at a level substantially equal to said maximum allowable output signal power level.

21. The method of claim 19, wherein said maximum allowable output signal power level is two watts.

22. A system for controlling an output signal power level of an outdoor unit of a wireless transmitter, said system comprising:

means for initializing an input signal power level of an input signal to said outdoor unit with an indoor unit such that said output signal power level is substantially equal to a predetermined threshold;

means for independently controlling said output signal power level with an attenuation means of said outdoor unit in accordance with a comparison of said output signal power level and said predetermined threshold;

detector means for detecting said output signal power level of said outdoor unit;

means for monitoring said output signal power level;

means for comparing said output signal power level to said predetermined threshold and controlling said attenuation means;

means for generating and monitoring one or more status signals, said status signals including data representing said input and output signal power levels; and means for muting said output signal power level if any of said status signals indicates an error in said outdoor unit.

23. The system of claim 22, further comprising means for programming said predetermined threshold.

24. The system of claim 22, wherein said means for muting said output signal power level mutes said output signal power level if said output signal power level is above said predetermined threshold after said attenuation means is set to a maximum attenuation level.

25. The system of claim 22, further comprising
means for communicating said data from said outdoor unit to said indoor unit; and
means for reinitializing said input signal power in accordance with said data 26. The system of claim 25, wherein, if said data indicates that said output signal power level is substantially less than said predetermined threshold, said means for reinitialize said input signal power level reinitializes said input signal power level such tat said output signal power level is substantially equal to said predetermined threshold.

27. The system of claim 22, further comprising means for compensating for temperature changes in said outdoor unit.

28. The system of claim 22, wherein said predetermined threshold is a maximum allowable output signal power level.

29. The system of claim 28, wherein said means for independently controlling said output signal power level comprises means for continuously maintaining said output signal power level at a level substantially equal to said maximum allowable output signal power level.

30. The system of claim 28, wherein said maximum allowable output signal power level is two watts.

* * * * *